(12) United States Patent
Choi

(10) Patent No.: US 7,868,805 B2
(45) Date of Patent: Jan. 11, 2011

(54) DIGITAL-ANALOG (D/A) CONVERTER AND DATA DRIVER AND FLAT PANEL DISPLAY USING THE D/A CONVERTER AND DATA DRIVER

(75) Inventor: Byong Deok Choi, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/010,870

(22) Filed: Jan. 30, 2008

(65) Prior Publication Data

US 2008/0186216 A1 Aug. 7, 2008

(30) Foreign Application Priority Data

Feb. 2, 2007 (KR) ...................... 10-2007-0011104

(51) Int. Cl.
*H03M 1/66* (2006.01)

(52) U.S. Cl. ...................................... 341/144; 341/145

(58) Field of Classification Search ................ 341/144, 341/154; 345/690, 87; 365/203
See application file for complete search history.

(56) References Cited

U.S. PATENT DOCUMENTS

| | | | | |
|---|---|---|---|---|
| 6,525,556 | B2 * | 2/2003 | Matsueda ................... | 324/770 |
| 6,674,420 | B2 * | 1/2004 | Matsueda et al. ............. | 345/87 |
| 7,388,532 | B2 * | 6/2008 | Yen ............................ | 341/144 |
| 2006/0077738 | A1 * | 4/2006 | Kwon ......................... | 365/203 |

FOREIGN PATENT DOCUMENTS

| | | |
|---|---|---|
| KR | 100257067 | 2/2000 |
| KR | 1019990020095 | 2/2000 |
| KR | 1020010016901 | 3/2001 |
| KR | 10-2004-0061666 | 7/2004 |
| KR | 1020060031379 | 4/2006 |

OTHER PUBLICATIONS

*Notice of Allowance* from the KIPO issued in Applicant's corresponding Korean Patent Application No. 2007-0011104 dated Aug. 11, 2008.

* cited by examiner

*Primary Examiner*—Joseph Lauture
(74) *Attorney, Agent, or Firm*—Robert E. Bushnell, Esq.

(57) ABSTRACT

A Digital-Analog (D/A) converter, a data driver and a flat panel display using the D/A converter and data driver includes a controller to generate a first control signal or a second control signal according to a bit value of data supplied thereto. A voltage generator is disposed between a first voltage and a second voltage, and includes a plurality of resistors for dividing the first voltage and the second voltage. First switches are coupled to respective nodes of the resistors. Capacitors are respectively coupled to the first switches, and are charged with turning-on or turning-off the first switches. Second switches are respectively coupled to the first switches, and transfer the first control signal or the second control signal to the first switches. Shift registers are respectively coupled to the second switches, and supply reset signals or shift signals.

26 Claims, 10 Drawing Sheets

DIGITAL-ANALOG (D/A) CONVERTER AND DATA DRIVER AND FLAT PANEL DISPLAY USING THE D/A CONVERTER AND DATA DRIVER

CLAIM OF PRIORITY

This application makes reference to, incorporates the same herein, and claims all benefits accruing under 35 U.S.C. §119 from an application for DIGITAL-ANALOG CONVERTER AND DATA DRIVER AND FLAT PANEL DISPLAY USING THE SAME earlier filed in the Korean Intellectual Property Office on 2 Feb. 2007 and there duly assigned Serial No. 10-2007-0011104.

BACKGROUND THE INVENTION

1. Field of the Invention

The present invention relates to a Digital-Analog (D/A) Converter, a data driver and a flat panel display using the D/A converter and data driver, and more particularly, the present invention relates to a D/A converter, a data driver and a flat panel display using the D/A converter and data driver capable of minimizing a needed area.

2. Description of the Related Art

Recently, various flat plate displays capable of reducing weight and volume that are disadvantages of cathode ray tubes (CRTs) have been developed. Flat panel displays include Liquid Crystal Displays (LCDs), Field Emission Displays (FEDs), Plasma Display Panels (PDPs), and Organic Light Emitting Displays (OLEDs).

Among the flat panel displays, an LCD expresses an image while controlling a penetration or a non-penetration of light generated by an external back light. Due to a development of a technique, such an LCD may express images of a large area with a high resolution and accordingly, has been used in various fields. Furthermore, an OLED displays images using an organic light emitting diode, which generates light by a recombination of electrons and holes. Since the OLED has a high response speed and has a low power consumption, it comes into the spotlight as the next generation display.

Each LCD and OLED includes pixels, a data driver, and a scan driver. The pixels are disposed at intersection points of the scan lines and the data lines. The data driver drives the data lines. The scan driver drives the scan lines.

The scan driver sequentially supplies a scan signal to the scan lines to sequentially select the pixels in horizontal lines. The data driver supplies a data signal to the data lines in synchronism with the scan signal from the scan lines. Accordingly, the data signal is supplied to pixels selected by the scan signal, and images of a predetermined luminance are expressed corresponding to the supplied data signal.

The data driver uses a D/A converter to convert external digital data into a predetermined voltage value, namely, the data signal.

FIG. 1 is a view of an 8 bit D/A converter.

With reference to FIG. 1, the D/A converter includes a voltage generator 2 and a voltage selector 4. The voltage generator 2 generates voltages. The voltage selector 4 selects any one of the voltages generated by the voltage generator.

The voltage generator 2 divides externally input voltages VRH and VRL into a plurality of voltages. To do this, the voltage generator 2 includes a plurality of resistors R0 to R255, which are disposed between a first voltage VRH and a second voltage VRL. The resistors R0 to R255 are disposed between the first voltage VRH and the second voltage VRL in series, and divide the first voltage VRH and the second voltage VRL into a plurality of voltages.

The voltage selector 4 includes a plurality of switches SW and a decoder 6. The plurality of switches SW are disposed between respective resistors R0 to R255 and an output terminal OUT. The decoder 6 controls a turning-on/off of the plurality of switches SW.

The plurality of switches SW are disposed between respective nodes of the resistors R0 to R255 and an output terminal OUT. For example, when data has eight bits, eight switches are disposed between respective nodes of the resistors R0 to R255 and an output terminal OUT.

The decoder 6 controls turning-on/off of the switches SW according to a bit value of externally input data. In practice, the decoder 6 controls turning-on/off of the switches SW so that one of voltages supplied to the respective resistors R0 to R255 is supplied to an output terminal OUT.

The decoder 6 receives externally supplied data and controls turning-on/off of the switches SW according to a bit value of the data to supply one of voltages generated by the voltage generator 2 to the output terminal OUT. The voltage supplied to the output terminal OUT is supplied to a pixel as a data signal.

However, since the D/A converter includes a plurality of switches SW, a large amount of area is needed. For example, when the data has eight bits, 2048 switches SW are inserted in the voltage selector 4. In particular, because the D/A converter of FIG. 1 is installed at respective data lines or channels, its manufacturing cost is increased due to the D/A converter and the size of a needed panel is increased.

SUMMARY OF THE INVENTION

Accordingly, it is an aspect of the present invention to provide a D/A converter, a data driver and a flat panel display using the D/A converter and data driver and capable of minimizing a needed area.

The foregoing and/or other aspects of the present invention are achieved by providing a Digital-Analog (D/A) converter including: a controller for generating a first control signal or a second control signal according to a bit value of data supplied thereto; a voltage generator disposed between a first voltage and a second voltage, and including a plurality of resistors for dividing the first voltage and the second voltage; first switches coupled to respective nodes of the resistors; capacitors coupled to the first switches, respectively, and being charged with turning-on or turning-off of the first switches; second switches coupled to the first switches, respectively, for transferring the first control signal or the second control signal to the first switches; and shift registers coupled to the second switches, respectively for supplying reset signals or shift signals.

Preferably, the shift registers simultaneously supply the reset signals, and the second switches are turned-on when the reset signals are supplied. More preferably, the first control signal is supplied to the first switches to turn-off the first switches during a supply time period of the reset signal. Most preferably, the shift registers sequentially supply the shift signal to sequentially turn-on the second switches. Also, the controller supplies the second control signal in synchronism with one of the shift signals, and supplies the first control otherwise. Also, the first switch is turned-on when it receives the second control signal to output one of a plurality of voltages generated by the voltage generator as a data signal. The D/A converter further includes a precharge switch coupled between a node of the voltage generator generating the lowest voltage and an output terminal. Also, the precharge switch is turned-on prior to an output of the data signal. Also, $2^k$ (k is a natural number) shift registers are set when the data has k bits. Also, the voltage generates $2^k$ voltage.

According to a second aspect of the present invention, a data driver is provided including: a first shift register unit for sequentially a sampling signal; a sampling latch unit for sequentially storing data corresponding to the sampling signal; a holding latch unit for storing the data stored in the sampling latch unit and simultaneously outputting the stored data; a data signal generator including a plurality of Digital-Analog (D/A) converters for generating a data signal corresponding to the data from the holding latch unit; and second shift registers coupled to the D/A converters for supplying reset signals and shift signals, each of the D/A converters including: a voltage generator disposed between a first voltage and a second voltage and including a plurality of resistors for dividing the first voltage and the second voltage; a controller for generating a second control signal at a specific time and a first control signal otherwise according to a bit value of the data; and a signal generator for outputting one of the voltages generated by the voltage generator in synchronism with the shift signal as the data signal when the second control signal is supplied.

Preferably, the signal generator includes: first switches coupled to respective nodes of the resistors; capacitors coupled to the first switches and being charged with a voltage corresponding to turning-on or turning-off of the first switches; and second switches coupled to the first switches, respectively for transferring the first control signal or the second control signal to the first switches. More preferably, the reset signal is simultaneously supplied to the second shift registers to simultaneously turn-on the second switches. More preferably, the first control signal is supplied to the first switches to turn-off the first switches during a supply time period of the reset signal. Also, the shift registers sequentially supply the shift signal to sequentially turn-on the second switches. Also, one of the first switches is turned-on to output the data according to the second control signal supplied in synchronism with one of the shift signals. The data driver further includes a precharge switch coupled between a node of the voltage generator generating the lowest voltage and an output terminal. Also, the precharge switch is turned-on prior to an output of the data signal.

According to another embodiment of the present invention, a flat panel display is provided including: a scan driver for sequentially supplying a scan signal to scan lines; a data driver including: a first voltage generator including a plurality of resistors for dividing a first voltage and a second voltage; first Digital-Analog (D/A) converters for receiving an upper i-th (i is a natural number less than k) bit of data of k (k is a natural number) bits and outputting two adjacent voltages among voltages generated by the first voltage generator corresponding to input i-th bit; second voltage generators for dividing the two voltages from the first D/A converter; second D/A converters for outputting one of voltages generated by the second voltage generators as the data signal corresponding to upper bits among the data of k bits except the i-th bit; and shift registers coupled to the second D/A converters for supplying reset signals and shift signals; and pixels for generating light corresponding to the data signal, each of the second D/A converters including: a controller for generating a second control signal at a specific time and a first control signal otherwise according to a bit value of the data; and a signal generator for outputting one of the voltages generated by the voltage generator in synchronism with the shift signal as the data signal when the second control signal is supplied.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
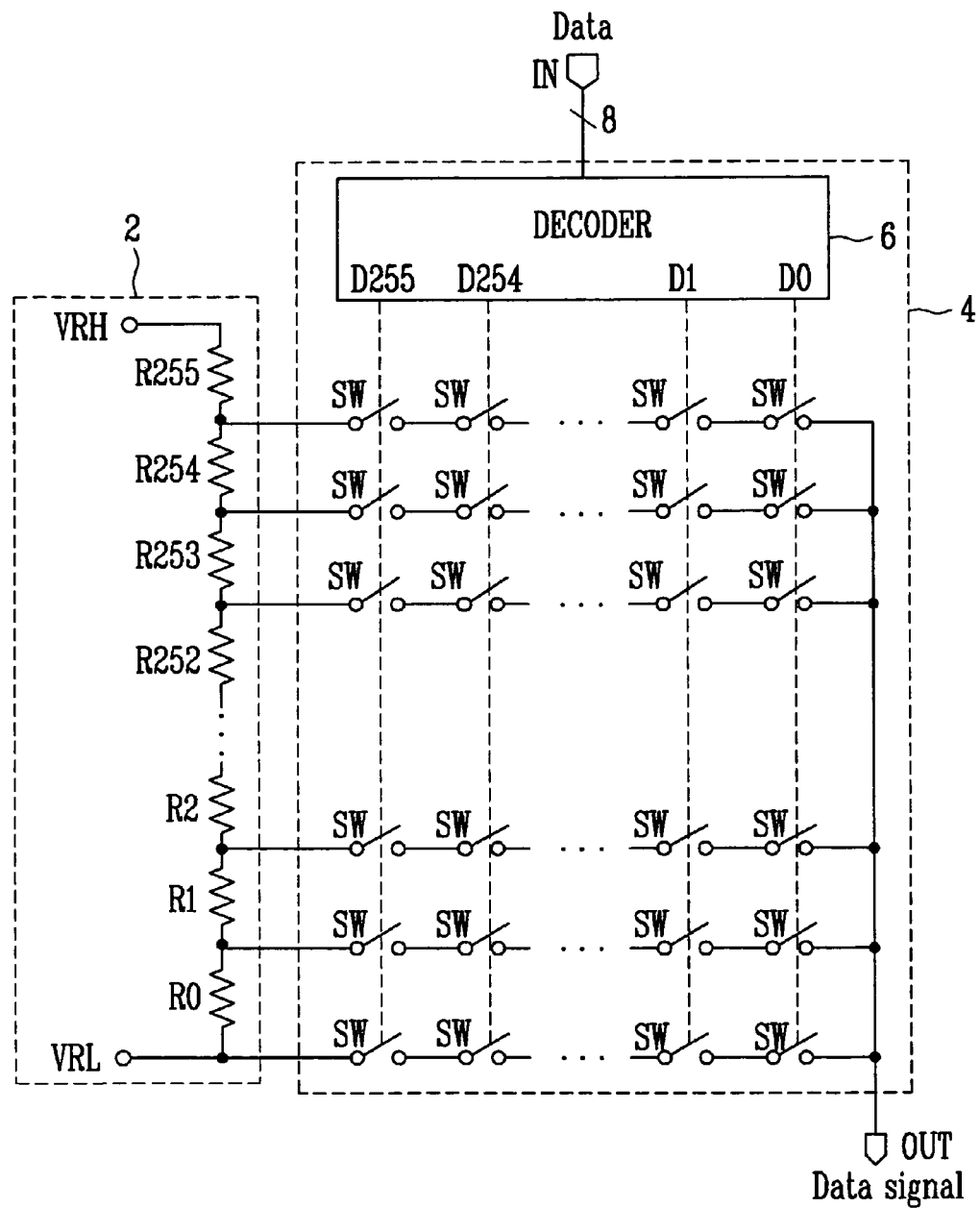
FIG. 1 is a view of a D/A converter.

Hereinafter, exemplary embodiments according to the present invention are described with reference to the accompanying drawings. When one element is coupled to another element, one element may be not only directly coupled to another element but also indirectly coupled to another element via another element. Furthermore, irrelevant elements have been omitted for clarity. Also, like reference numerals refer to like elements throughout.

Figure 2:
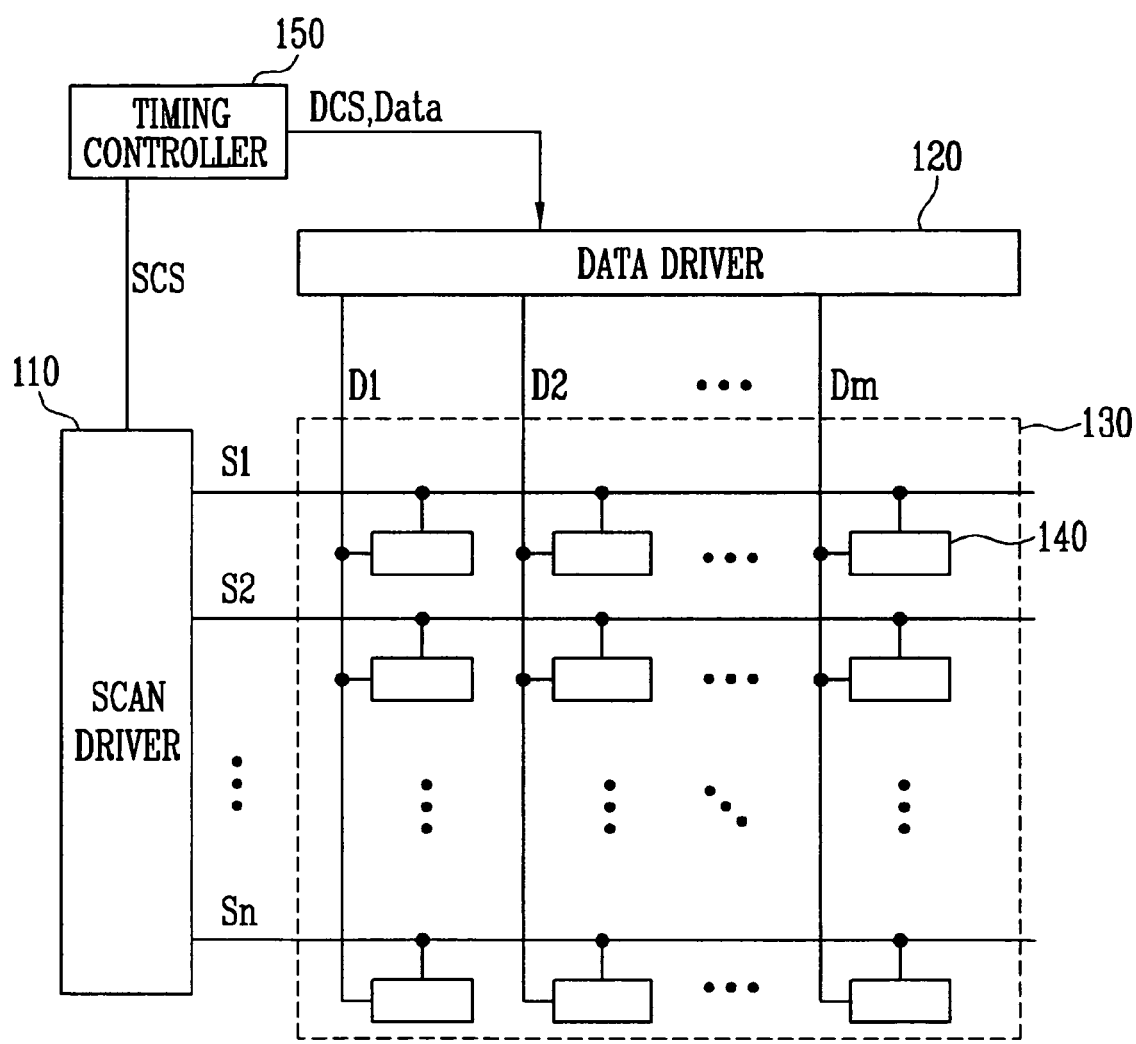
FIG. 2 is a view of a flat panel display according to an embodiment of the present invention.

FIG. 2 is a view of a flat panel display according to an embodiment of the present invention.

With reference to FIG. 2, the flat panel display according to a first embodiment of the present invention includes a pixel unit 130, a scan driver 110, a data driver 120, and a timing controller 150. The pixel unit 130 includes a plurality of pixels 140, which are coupled to scan lines S1 to Sn and data lines D1 to Dm. The scan driver 110 drives the scan lines S1 to Sn. The data driver 120 drives the data lines D1 to Dm. The timing controller 150 controls the scan driver 110 and the data driver 120.

The scan driver 110 receives the scan driving control signal SCS from a timing controller 150. The scan driver 110 receives the scan driving control signal and sequentially provides a scan signal to the scan lines S1 through Sn.

The data driver 120 receives a data driving signal DCS from the timing controller 150. The data driver 120 receives the data driving signal DCS and provides a data signal to the data lines D1 through Dm in synchronism with the data signal.

The timing controller 150 generates a data driving signal DCS and a scan driving signal SCS corresponding to the externally supplied synchronizing signals. The data driving signal DCS generated by the timing controller 150 is provided to the data driver 120, and the scan driving signal SCS is provided to the scan driver 110. The data driving signal DCS includes a source start pulse, a source shift clock, and a source output enable signal.

The pixel unit 130 includes pixels 140, which are disposed at intersection points of the scan lines S1 to Sn and the data lines D1 to Dm. When the scan signal is supplied, the pixels 140 are selected and receive a data signal. The pixels 140, having received the data signal, supply light of a luminance corresponding to the externally provided data signal, so that the pixel unit 130 expresses images of a predetermined luminance.

On the other hand, one of the displays, including a data driver 120 for receiving externally provided data and generating an analog voltage, namely, a data signal using the received data, is selected as the flat panel display of the present invention. For example, an LCD or an OLED can be selected as the flat panel display.

Figure 3:
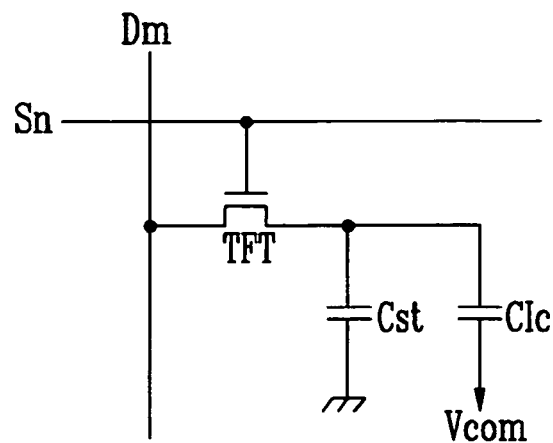
FIG. 3 is a view of an example of a pixel when the flat panel display of FIG. 2 is an LCD.

FIG. 3 is a view of an example of a pixel when the flat panel display of FIG. 2 is an LCD. For convenience of the description, FIG. 3 is a view of a pixel coupled to an n-th scan line Sn and an m-th data line Dm.

Referring to FIG. 3, the pixel 140 includes a Thin Film Transistor (TFT), a storage capacitor Cst, and a liquid crystal capacitor Clc. The TFT is disposed between the scan line Sn and the data line Dm. The storage capacitor Cst and the liquid crystal capacitor Clc are coupled to the TFT.

When a scan signal is supplied to the scan line Sn, the TFT is turned-on. When the TFT is turned-on, a data signal supplied to the data line Dm is transferred to the storage capacitor Cst.

When the data signal is supplied to the storage capacitor Cst, the storage capacitor stores a voltage corresponding to the data signal.

The liquid crystal capacitor Clc equivalently expresses a liquid crystal between a pixel electrode (not shown) coupled to a source electrode of the TFT and a common electrode (not shown). The liquid crystal capacitor Clc controls an optical transmittance of the liquid crystal.

The configuration of the pixel 140 of FIG. 3 is an embodiment of the present invention. However, the present invention is not limited thereto. In practice, a configuration of the pixel 140 can be variously changed, and including at least one TFT.

Figure 4:
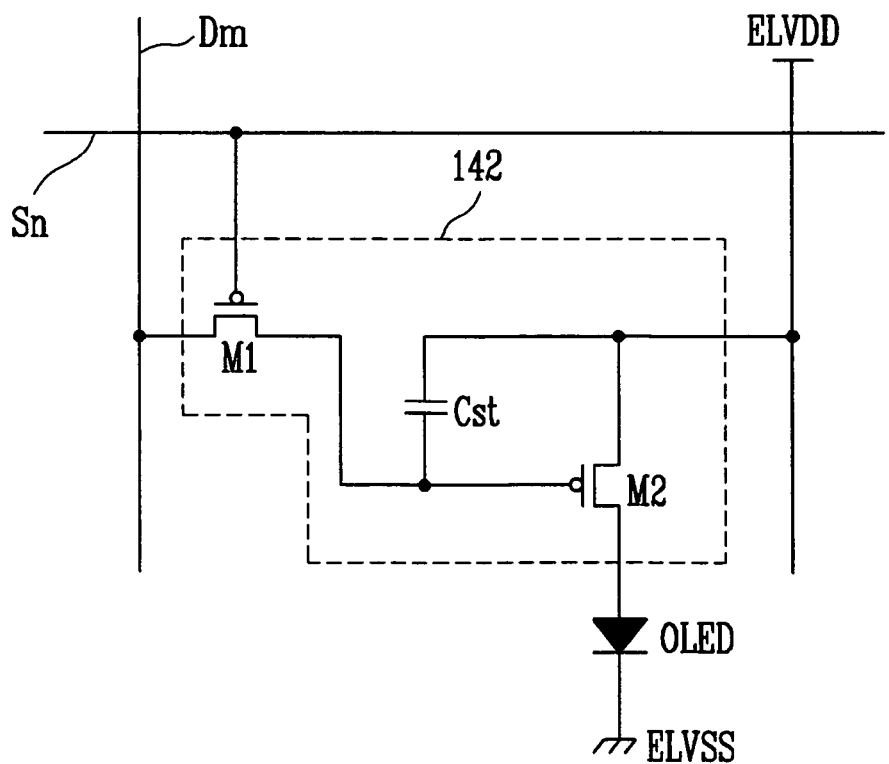
FIG. 4 is a view of a pixel when the flat panel display of FIG. 2 is an OLED.

FIG. 4 is a view of a pixel when the flat panel display of FIG. 2 is an OLED. For convenience of the description, FIG. 4 is a view of a pixel coupled to an n-th scan line Sn and an m-th data line Dm.

With reference to FIG. 4, the pixel 140 includes an OLED and a pixel circuit 142. The pixel circuit 142 is coupled to the data line Dm and the scan line Sn, and controls the OLED.

An anode electrode of the OLED is coupled to the pixel circuit 142, and a cathode electrode thereof is coupled to a second power supply ELVSS. The OLED generates light of a predetermined luminance corresponding to an electric current supplied from the pixel circuit 142.

When the scan signal is supplied to the scan line Sn, the pixel circuit 142 controls an electric current amount supplied to the OLED corresponding to a data signal supplied to the data line Dm. To do this, the pixel circuit 142 includes a first transistor M1, a second transistor M2, and a storage capacitor Cst. The first transistor M1 is coupled between the data line Dm and the scan line Sn. The second transistor M2 is coupled between a first power supply ELVDD and the OLED. The storage capacitor Cst is coupled between a gate electrode and a first electrode of the second transistor M2.

A gate electrode of the first transistor M1 is coupled to the scan line Sn, and a first electrode thereof is coupled to the data line Dm. Furthermore, a second electrode of the first transistor M1 is coupled to a first terminal of the storage capacitor Cst. The first electrode is one of a source electrode and a drain electrode, whereas the second electrode is the other of the source electrode and the drain electrode. For example, when the first electrode is as a source electrode, the second electrode is the drain electrode. When the scan signal is supplied to the scan line Sn, the first transistor M1 is turned-on to provide the data signal from the data line Dm to the storage capacitor Cst. The storage capacitor Cst is charged to a voltage corresponding to the data signal.

A gate electrode of the second transistor M2 is coupled to a first terminal of the storage capacitor Cst, and a first electrode thereof is coupled to a second terminal of the storage capacitor Cst and the first power supply ELVDD. Furthermore, a second electrode of the second transistor M2 is coupled to an anode electrode of the OLED. The second transistor M2 controls an electric current amount from the first power supply ELVDD to the second power supply ELVSS through the OLED. The OLED generates light corresponding to an electric current amount supplied by the second transistor M2.

The configuration of the pixel 140 of FIG. 4 is an embodiment of the present invention. However, the present invention is not limited thereto. In practice, a configuration of the pixel 140 can be variously changed, and including a plurality of TFTs.

Figure 5:
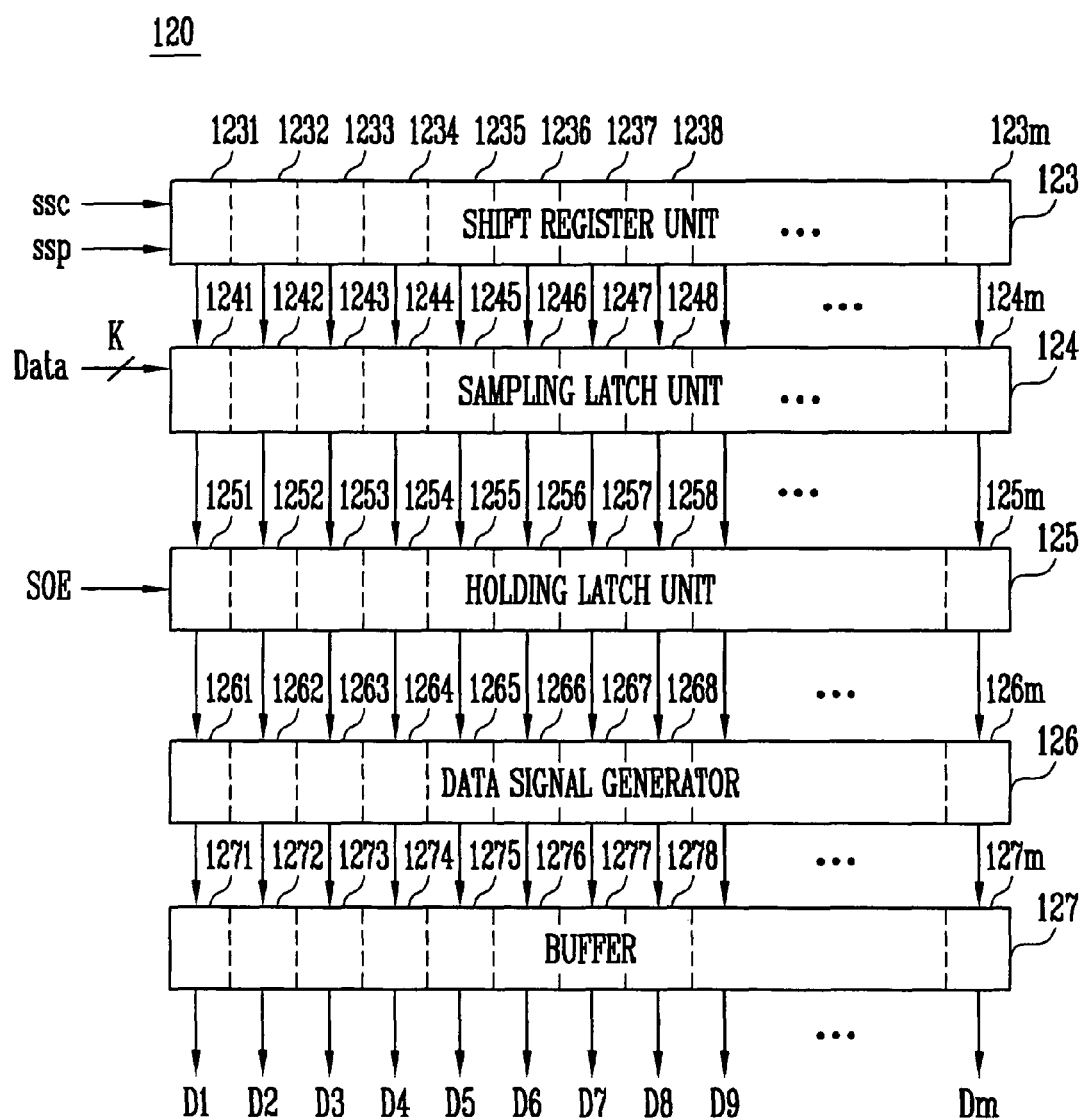
FIG. 5 is a block diagram of the data driver of FIG. 2.

FIG. 5 is a view of a data driver according to an embodiment of the present invention. For convenience of the explanation, in FIG. 5, it is assumed that the data driver has m channels.

Referring to FIG. 5, the data driver 120 according to an embodiment of the present invention includes a shift register unit 123, a sampling latch unit 124, a holding latch unit 125, a data signal generator 126, and a buffer 127. The shift register unit 123 sequentially generates a sampling signal. The sampling latch unit 124 sequentially stores data in response to a sampling signal. The holding latch unit 125 receives the data stored in the sampling latch unit 124, and generates a counting signal corresponding to a bit value of the received data. The data signal generator 126 generates a data signal corresponding to the bit value of the data. The buffer 127 provides the data signal to the data lines D1 to Dm.

The shift register unit 123 receives a source shift clock SSC and a source start pulse SSP from the timing controller 150. When the shift register unit 123 receives a source shift clock SSC and a source start pulse SSP, it shifts the source start pulse SSP corresponding to the source shift clock SSC to sequentially generate m sampling signals. In order to do this, the shift register unit 123 includes m shifter registers 1231 to 123m.

The sampling latch unit 124 sequentially stores data corresponding to the sampling signal sequentially supplied from the shift register unit 123. To do this, the sampling latch unit 124 includes m sampling latches 1241 to 124m for storing m data. The sampling latches 1241 to 124m are arranged to store k bits of data.

When the holding latch unit 125 receives a control signal CS of a second polarity supplied by the timing controller 150, it receives and stores the data from the sampling latch unit 125. When the holding latch unit 125 receives a control signal CS of a first polarity, it generates a counting signal corresponding to a bit value of data inputted thereto, and provides it to the data signal generator 126. The holding latches 1251 to 125m are arranged to store k bits of data.

The data signal generator 126 receives an externally supplied ramp pulse. When the data signal generator 126 receives the ramp pulse, it generates a data signal using a voltage value of a ramp pulse at a stop time of the counting signal, and provides it to the buffer 127. The data signal generator 126 includes m D/A converters DAC 1261 to 126*m*, which are disposed at respective channels.

The buffer 127 provides the data signal from the data signal generator 126 to the data lines D1 to Dm. The buffer 127 can be omitted. If so, the data signal generator 126 is directly coupled to the data lines D1 to Dm.

Figure 6:
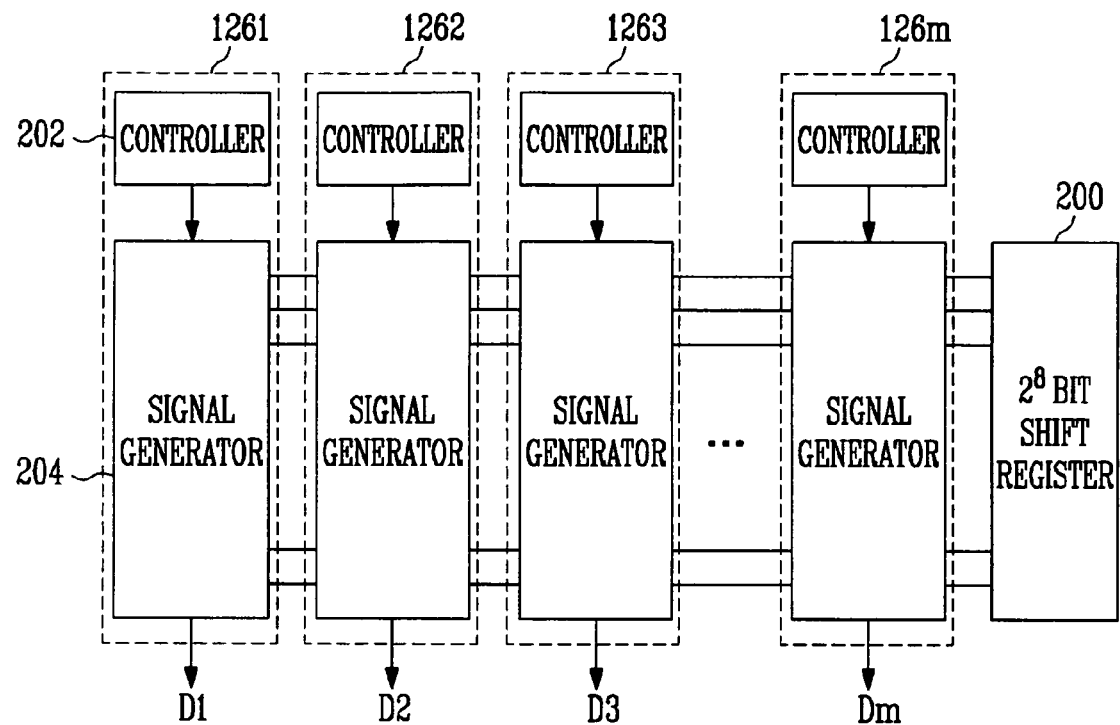
FIG. 6 is a view of an example of the data signal generator shown in FIG. 5.

FIG. 6 is a view of an example of the data signal generator of FIG. 5. Hereinafter, for convenience of the explanation, it is assumed that there are eight bits of data.

With reference to FIG. 6, the data signal generator 126 of the present invention includes D/A converters 1261 to 126*m* and shift registers 200. The D/A converters 1261 to 126*m* are disposed at respective channels. The shift registers 200 are coupled to the D/A converters 1261 to 126*m* in common.

Each of the D/A converters 1261 to 126*m* includes a controller 202 and a signal generator 204.

The shift registers 200 supplies a reset signal and a shift signal to the signal generators 204. The reset signal is simultaneously supplied from all of the shift registers 200, and a shift signal is sequentially supplied from the shift registers 200. When there is eight bits of data, the shift registers 200 include 28 registers, namely, 256 shift registers.

The controller 202 receives data from the holding latch unit 125. The controller 202 included in the first D/A converter 1261 receives data from a first holding latch 1251, and the controller 202 included in an n-th D/A converter 126*m* receives the data from an n-th holding latch 125*m*. When the controller 202 receives the data, it generates a control signal corresponding to a bit value of the data, and supplies the generated control signal to the signal generator 204. In practice, the controller 202 supplies a second control signal at a specific time according to the bit value of the data, and supplies a first control signal in another case.

The signal generator 204 generates a data signal of a predetermined voltage corresponding to a specific time when the second control signal is supplied, and supplies the generated data signal to a data line D or the buffer 127.

Figure 7:
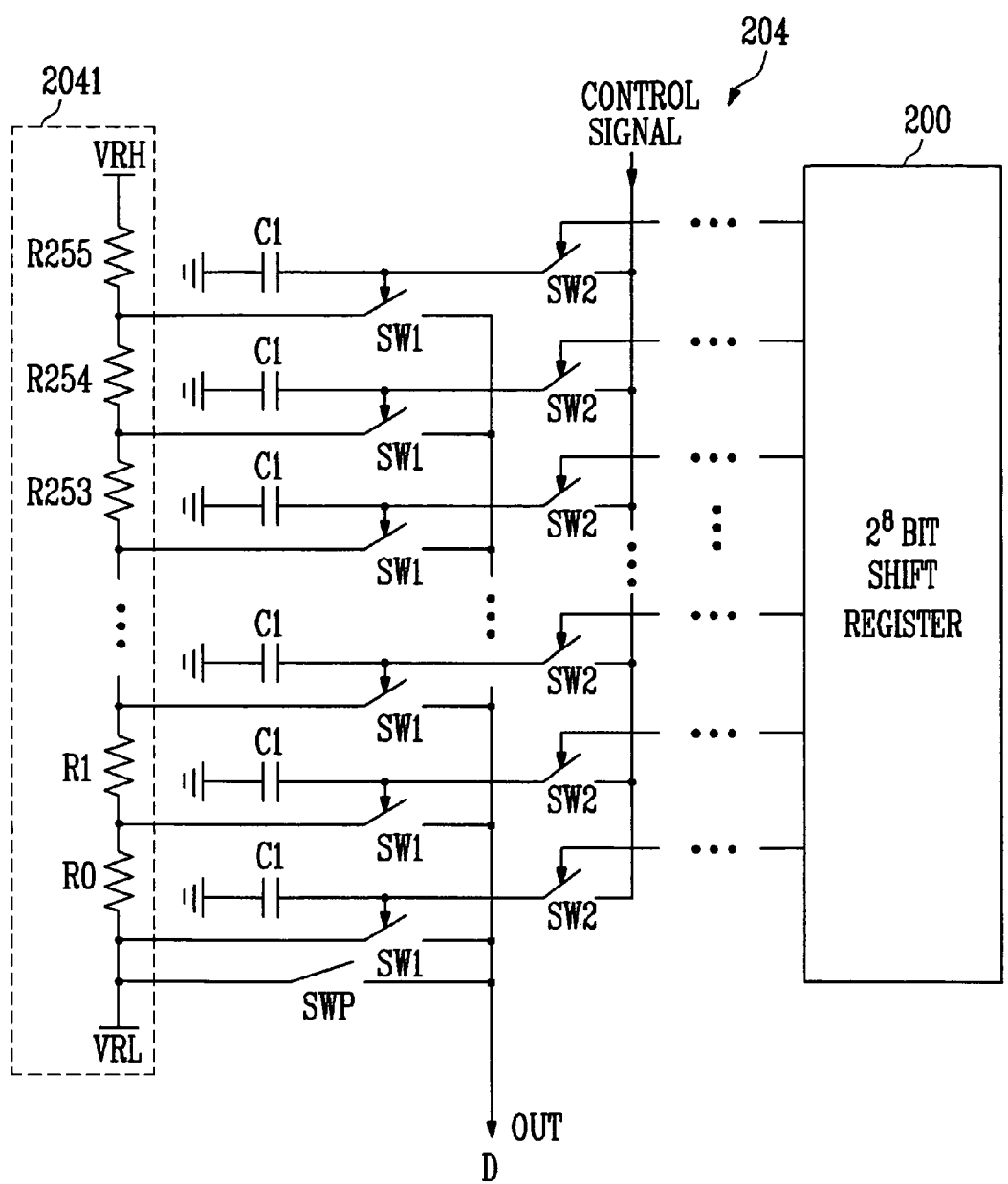
FIG. 7 is a view of an example of a signal generator of FIG. 6.

FIG. 7 is a view of an example of the signal generator of FIG. 6.

Referring to FIG. 7, the signal generator 204 of the present invention includes a voltage generator 2041, first switches SW1, second switches SW2, a precharge switch SWP, and capacitors C1.

The voltage generator 2041 divides externally supplied input voltages VRH and VRL into a plurality of voltages. To do this, the voltage generator 2041 includes a plurality of resistors R0 to R255, which are disposed between a first voltage VRH and a second voltage VRL The resistors R0 to R255 are disposed between the first voltage VRH and the second voltage VRL in series, and divide the first voltage VRH and the second voltage VRL into a plurality of voltages.

The first switches SW1 are installed between respective nodes of the resistors R0 to R255 and an output terminal OUT, namely, a data line D. The first switches SW1 are turned-on or turned-off according to a first control signal or a second control signal supplied when the second switches SW2 are turned-on.

The second switches SW2 are coupled to the first switches SW1, respectively. When a ramp signal or a shift signal is supplied to the second switches SW2, they are turned-on to supply the first control signal or the second control signal from the controller 202 to the first switches SW1.

The capacitors C1 are coupled to gate electrodes of each switch SW1. The capacitor C1 is charged with a voltage corresponding to the first control signal or the second control signal. That is, the capacitor C1 is charged with the first control signal or the second control signal to stably maintain turn-on/off states of the first switches SW1 during a predetermined time period. The capacitor C1 is set by one a parasitic capacitor in each of the first switches SW1 and an external capacitor.

The precharge switch SWP is a node (namely, between a resistor RO and the second voltage VRL) of the voltage generator 2041 generating the lowest voltage (namely, a voltage of the lowest gradation) and an output terminal OUT. The precharge switch SWP is used to previously charge the data line D prior to a supply of the data signal.

The signal generator 204 according to the present invention includes 512 switches. Since the number of switches in the D/A converters 1261 to 126*m* is reduced in comparison with the related art, the present invention can reduce an area. Furthermore, a reduced number of switches reduces a possibility of an erroneous operation, thereby improving the reliability.

FIG. 7 shows that the voltage generator 2041 is installed inside the signal generator 204. However, the present invention is not limited thereto. For example, the voltage generator 2041 can be installed exterior to the signal generator 204 and coupled thereto.

Figure 8:
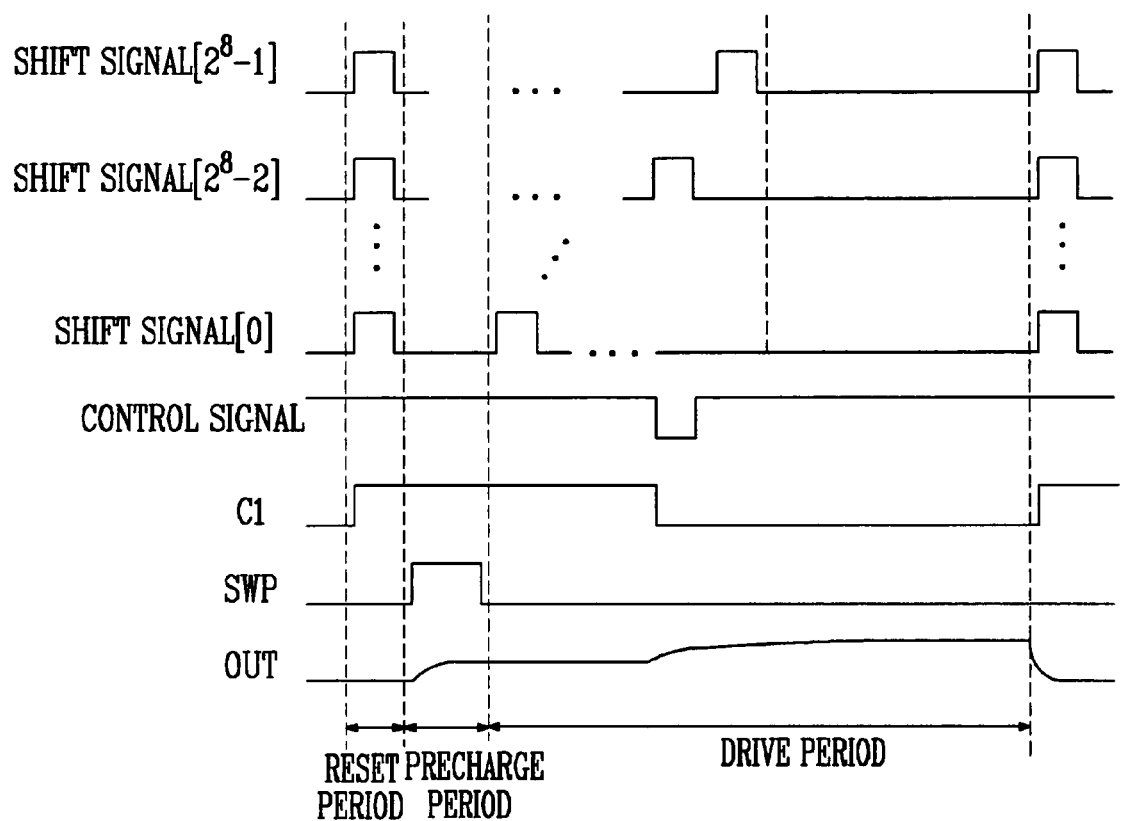
FIG. 8 is a waveform diagram of the operation of the signal generator of FIG. 7.

FIG. 8 is a waveform diagram of an operation of the signal generator of FIG. 7. For convenience of the description, in FIG. 7, it is assumed that the first switches SW1 are P-type switches and the second switches SW2 are N-type switches.

Referring to FIG. 8, the signal generator 204 provides a reset period, a precharge period, and a drive period.

During the reset period, all of the shift registers 200 supply a reset signal. When all of the shift registers 200 supply a reset signal, all of the second switches SW2 are turned-on. The controller 202 outputs a first control signal of a first polarity. Accordingly, when the first switches SW1 are turned-on, the first control signal is supplied to the first switches SW1 to turn-off the first switches SW1. Accordingly, the capacitors C1 is charged with a voltage corresponding to the first control signal. Consequently, after the reset period, the first switches SW1 maintain a turn-off state due to the voltage charged in the capacitors C1.

During the precharge period, the precharge switch SWP is turned-on according to an externally supplied signal. When the precharge switch SWP is turned-on, the lowest gradation voltage of the voltage generator 2041 is supplied to the data line D, so that a parasitic capacitor equivalently formed at the data line D is precharged with the lowest gradation voltage. During the precharge period, when the data line is previously charged, a next supply time of the data signal can be reduced. On the other hand, the precharge can be omitted in the present invention.

During the drive period, the shift registers 200 sequentially supply a shift signal. For example, the shift signal is sequentially outputted from a second switch SW2 coupled to a first switch SW1 outputting the lowest gradation voltage to a second switch SW2 coupled to a first switch SW outputting the highest gradation voltage. The shift signal can be sequentially outputted from a second switch SW2 coupled to a first switch SW1 outputting the highest gradation voltage to a second switch SW2 coupled to a first switch SW outputting the lowest gradation voltage.

When the shift registers 200 sequentially supply the shift signal, the second switches SW2 are sequentially turned-on. On the other hand, the controller 202 supplies a second control signal of a low polarity at a specific time corresponding to a bit value of data inputted thereto. In practice, the control is supplied in synchronism with one of shift signals supplied from the shift registers 200.

In more detail, the second switches SW2 are sequentially turned-on, the controller 202 supplies a first control signal. Accordingly, the first control signal is supplied to the first switch SW1 through the second switch being turned-on. This causes the first switch SW1 to maintain a turn-on state.

On the other hand, when the second switch SW2 is turned-on at a specific time, the second control signal is supplied. Accordingly, the first switch SW1 having received the second control signal through the second switch SW2 being turned-on, is turned-on. When the first switch SW1 is turned-on, one of a plurality of voltages generated by the voltage generator 2041 is outputted to the data line D. The output voltage of the data line D is supplied to a pixel selected by a scan signal as the data signal.

Next, during the drive period, a first switch SW1 among a plurality of first switches SW having received the second control signal supplies the data signal to the data line D while maintaining a turn-on state.

Figure 9:
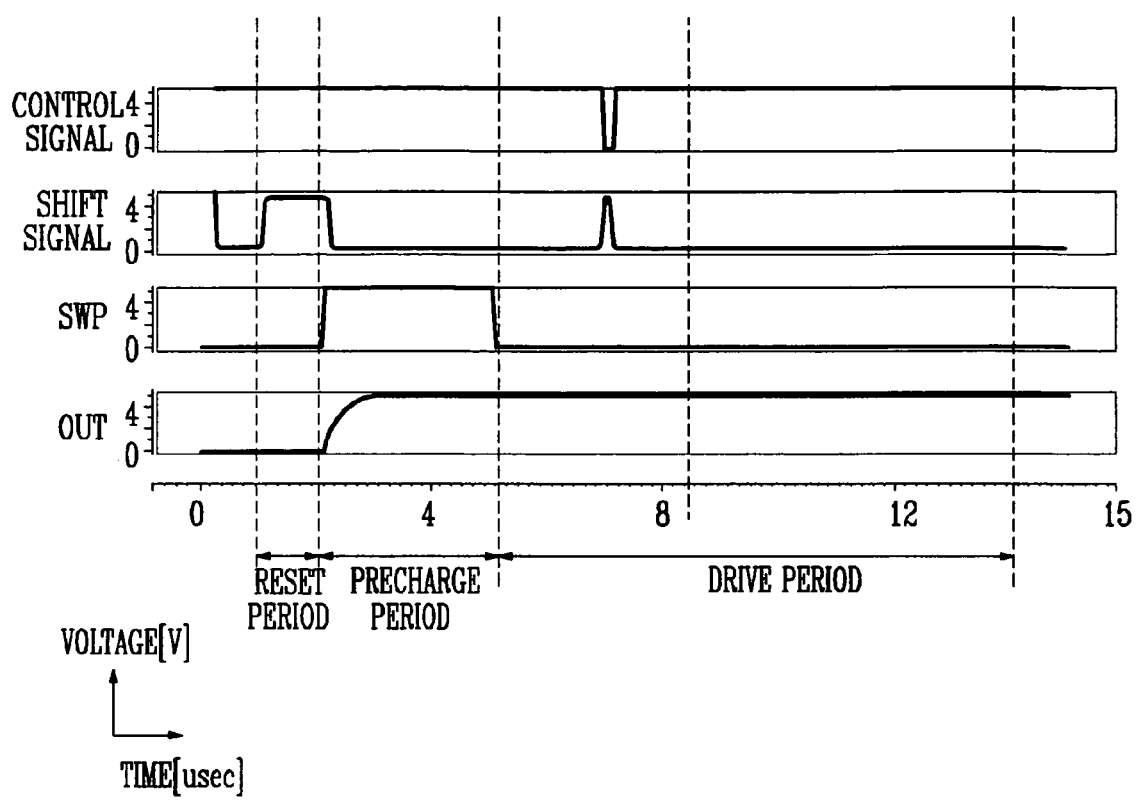
FIG. 9 is a view of a simulation result of the signal generator of FIG. 7.

FIG. 9 is a view of a simulation result of the signal generator of FIG. 7.

Referring to FIG. 9, during the precharge period, a voltage of the data line D is increased to the lowest gradation voltage due to the lowest gradation voltage supplied to the data line D. Furthermore, during the drive period, the data signal, namely, a voltage corresponding to a bit value of data is outputted to the data line D due to the second control signal supplied in synchronism with one of the plurality of shift signals. As the data signal is outputted to the data line D during the drive period, it is stably supplied to a pixel.

Figure 10:
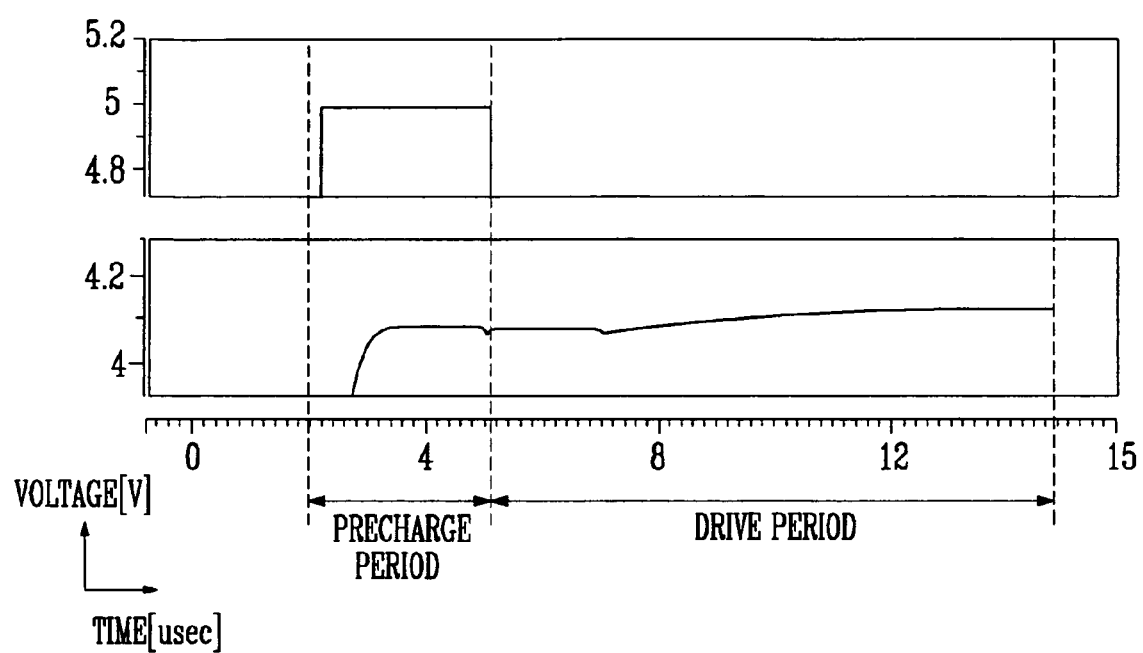
FIG. 10 is an enlarged view of the simulation result of FIG. 9.

On the other hand, FIG. 9 shows that the precharge voltage and a voltage of the data signal are similar to each other. However, in practice, as shown in FIG. 10, the voltage of the data signal is greater than the precharge voltage by a predetermined value. When the precharge voltage is selected as the data signal according to a bit of data, the precharge voltage is equal to the voltage of the data signal.

Figure 11:
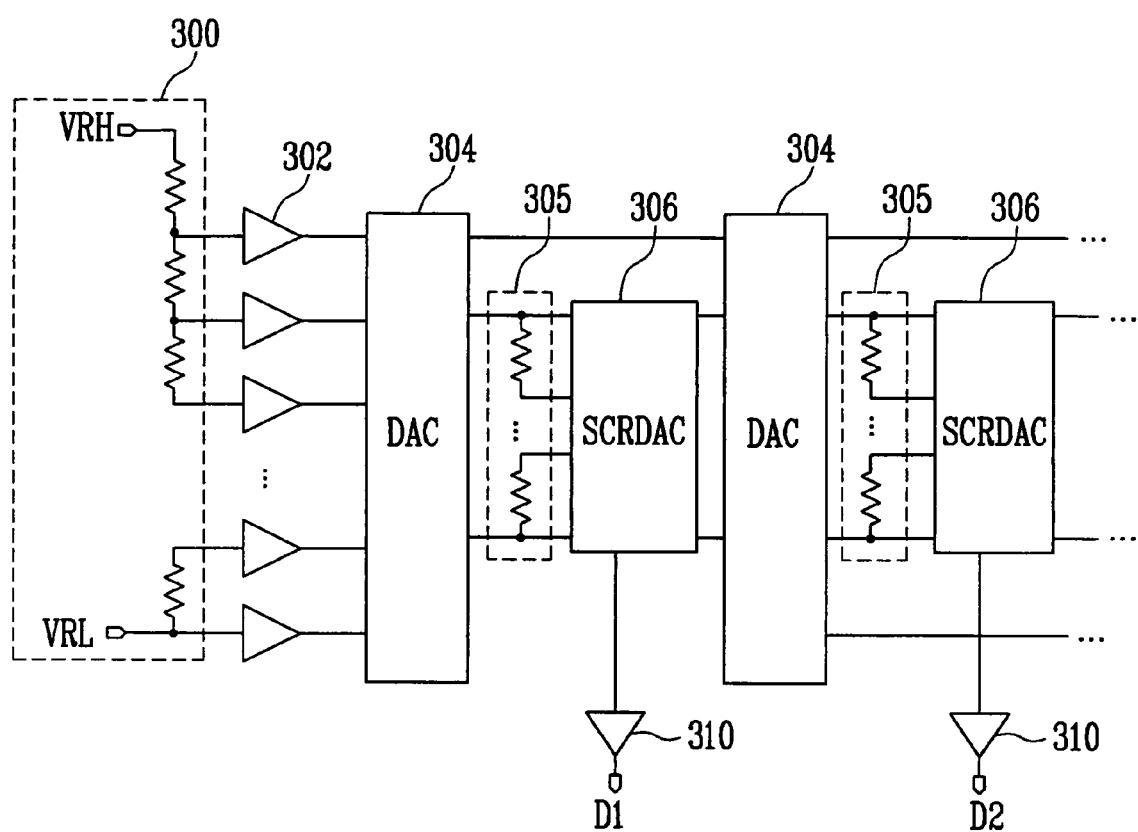
FIG. 11 is a view of an embodiment in which a D/A converter according to the present invention is used.

FIG. 10 is an enlarged view of the simulation result of FIG. 9. FIG. 11 is a view of an embodiment in which a D/A converter of the present invention and a conventional D/A converter are used together. For convenience of the explanation, the conventional D/A converter is referred to as 'DAC' or 'first D/A converter', whereas the D/A converter of the present invention is referred to as 'SCRDAC' or 'second D/A converter'. Furthermore, in FIG. 11, it is assumed that eight bits of data are inputted.

Referring to FIG. 11, a plurality of voltages generated by a first voltage generator 300 are supplied to DAC 304 through a buffer 302. Accordingly, the DAC 304 extracts two adjacent voltages corresponding to the upper 3 bits of data, and supplies the extracted voltage to a second voltage generator 305. A known D/A converter of various configurations can be used as the DAC 304. In practice, the DAC outputs two voltages corresponding to a predetermined bit of data. Furthermore, voltages outputted from the first voltage generator 300 can be used in all DACs in common, as shown in FIG. 11.

The second voltage generator 305 divides two voltages supplied thereto into a plurality of voltages, and provides the divided voltages to the SCRDAC 306. Next, the SCRDAC 306 generates one of the voltages provided from the second voltage generator 305 corresponding to a lower 5 bits of the data, and provides the voltage to the data line D through the buffer 310.

In the present invention, as shown in FIG. 6, a controller 202 for generating a control signal is included. However, in the present invention, it can receive the control signal from the holding latch unit 125 without the controller 202. An arrangement for supplying a control signal by the holding latch unit 125 is discussed in Korean Patent Application No. 10-2007-0011012, having the same filing data as that of the present application.

As is clear from the forgoing description, in the D/A converter, the data driver, and a flat panel display according to the present invention, the number of switches included in the D/A converter can be minimized in order to reduce an area of the D/A converter. In addition, as the number of switches included in the D/A converter is reduced, a possibility of an erroneous operation of the switches is reduced, thereby enhancing the reliability.

Although embodiments of the present invention have been shown and described, it would be appreciated by those skilled in the art that modifications can be made without departing from the principles and spirit of the present invention, the scope of which is defined by the following claims.

What is claimed is:

1. A data signal generator, comprising:
a controller for selectively generating one of a first control signal and a second control signal according to a bit value of data supplied to the controller;
a voltage generator for generating a plurality of voltages, the voltage generator including a plurality of resistors disposed between a first voltage and a second voltage, the voltage generator including a plurality of nodes, each of the nodes disposed between two of the resistors and supplying one of the plurality of the voltages;
a plurality of first switches, a voltage from one of the nodes being supplied to an output terminal through one of the first switches whenever the one of the first switches is turned on;
a plurality of second switches coupled to the controller, the one of the first control signal and the second control signal being supplied to one of the first switches through one of the second switches whenever the one of the second switches is turned on, the one of the first switches being tuned on or off whenever the one of the first control signal and the second control signal is supplied to the one of the first switches;
a plurality of capacitors, each of the capacitors coupled to a corresponding one of the second switches, the each of the capacitors being charged with the one of the first control signal and the second control signal supplied through the corresponding one of the second switches, the one of the first control signal and the second control signal stored in the each of the capacitors being supplied to one of the first switches that is coupled to the corresponding one of the second switches; and
a plurality of shift registers, each of the shift registers coupled to one of the second switches, each of the shift registers supplying one of a reset signal and a shift signal to the one of the second switches.

2. The data signal generator as recited in claim 1, wherein all of the shift registers supply the reset signals simultaneously during a reset period, the second switches being turned on whenever the reset signal is supplied to the second switches.

3. The data signal generator as recited in claim 2, wherein the controller supplies the first control signal to the first switches during the reset period, the first switches being turned off whenever the first control signal is supplied to the first switches.

4. The data signal generator as recited in claim 1, wherein each of the second switches is turned on whenever the shift signal is supplied to the each of the second switches, the shift registers sequentially supplying the shift signals to sequentially turn on the second switches during a drive period.

5. The data signal generator as recited in claim 4, wherein the controller supplies the second control signal in synchronism with one of the shift signals, and supplies the first control signal otherwise during the drive period.

6. The data signal generator as recited in claim 5, wherein each of the first switches is turned on whenever the second control signal is supplied to the each of the first switches.

7. The data signal generator as recited in claim 6, further comprising a precharge switch coupled between one of the nodes of the voltage generator generating the lowest voltage and the output terminal.

8. The data signal generator as recited in claim 7, wherein the precharge switch is turned on prior to the drive period.

9. The data signal generator as recited in claim 1, wherein $2^k$ (k being a natural number) shift registers are provided if the data supplied to the controller has k bits.

10. The data signal generator as recited in claim 9, wherein the voltage generator generates $2^k$ voltages.

11. A data driver, comprising:
a first shift register unit for sequentially generating a sampling signal;
a sampling latch unit for sequentially storing data corresponding to the sampling signal;
a holding latch unit for storing the data stored in the sampling latch unit and for simultaneously outputting the stored data;
a data signal generator including a plurality of Digital-Analog (D/A) converters for generating a data signal corresponding to the stored data outputted from the holding latch unit; and
second shift registers coupled to the D/A converters for supplying a reset signal and a shift signal to the D/A converters;
wherein each of the D/A converters includes:
a voltage generator for generating a plurality of voltages, the voltage generator including a plurality of resistors disposed between a first voltage and a second voltage, the voltage generator including a plurality of nodes, each of the nodes disposed between two of the resistors and supplying one of the plurality of the voltages;
a controller for generating a second control signal at a specific time and a first control signal otherwise according to a bit value of the data;
first switches, a voltage from one of the nodes being supplied to an output terminal through one of the first switches whenever the one of the first switches is turned on;
second switches coupled to the controller, the one of the first control signal and the second control signal being supplied to one of the first switches through one of the second switches whenever the one of the second switches is turned on, the one of the first switches being tuned on or off whenever the one of the first control signal and the second control signal is supplied to the one of the first switches, each of the second switches coupled to one of the shift register; and
capacitors, each of the capacitors coupled to a corresponding one of the second switches, the each of the capacitors being charged with the one of the first control signal and the second control signal supplied through the corresponding one of the second switches, the one of the first control signal and the second control signal stored in the each of the capacitors being supplied to one of the first switches that is coupled to the corresponding one of the second switches.

12. The data driver as recited in claim 11, wherein all of the shift registers supply the reset signals simultaneously during a reset period, the second switches being turned on whenever the reset signal is supplied to the second switches.

13. The data driver as recited in claim 12, wherein the first control signal is supplied to the first switches during the reset period, the first switches being turned off whenever the first control signal is supplied to the first switches.

14. The data driver as recited in claim 11, wherein each of the second switches is turned on whenever the shift signal is supplied to the each of the second switches, the shift registers sequentially supplying the shift signals to sequentially turn on the second switches.

15. The data driver as recited in claim 14, wherein the controller supplies the second control signal in synchronism with one of the shift signals, one of the first switches being turned on whenever the one of the first switches is supplied with the second control signal.

16. The data driver as recited in claim 11, further comprising a precharge switch arranged between one of the nodes of the voltage generator generating the lowest voltage and the output terminal.

17. The data driver as recited in claim 16, wherein the precharge switch is turned on prior to an output of the data signal.

18. A flat panel display, comprising:
a scan driver for sequentially supplying a scan signal to scan lines;
a data driver for supplying a data signal in synchronism with one of the scan signals; and
pixels disposed at an intersection of the scan lines and the data lines for discharging a voltage corresponding to the data signal in response to the scan signal being supplied, and for generating light corresponding to the discharged voltage;
wherein the data driver includes:
a first shift register unit for sequentially generating a sampling signal;
a sampling latch unit for sequentially storing data corresponding to the sampling signal;
a holding latch unit for storing the data stored in the sampling latch unit and for simultaneously outputting the stored data;
a data signal generator, including a plurality of Digital-Analog (D/A) converters, for generating a data signal corresponding to the stored data outputted from the holding latch unit; and
second shift registers coupled to the D/A converters for supplying reset signals and shift signals to the D/A converters;
wherein each of the D/A converters includes:
a voltage generator for generating a plurality of voltages, the voltage generator including a plurality of resistors disposed between a first voltage and a second voltage, the voltage generator including a plurality of nodes, each of the nodes disposed between two of the resistors and supplying one of the plurality of the voltages;
a controller for generating a second control signal at a specific time and a first control signal otherwise according to a bit value of the data; and first switches, a voltage from one of the nodes being supplied to an output terminal through one of the first switches whenever the one of the first switches is turned on;

second switches coupled to the controller, the first control signal or the second control signal being supplied to one of the first switches through one of the second switches whenever the one of the second switches is turned on, the one of the first switches being tuned on or off whenever the first control signal or the second control signal is supplied to the one of the first switches, each of the second switches coupled to one of the second shift registers; and capacitors, each of the capacitors coupled to one of the second switches, the each of the capacitors being charged with the first control signal or the second control signal supplied through the one of the second switches, the one of the first control signal and the second control signal stored in the each of the capacitors being supplied to one of the first switches that is coupled to the one of the second switches.

19. A flat panel display, comprising:

a scan driver for sequentially supplying a scan signal to scan lines;

a data driver for providing a data signal; and pixels for generating light corresponding to the data signal;

wherein the data driver includes:

a first voltage generator for generating a plurality of voltages, the voltage generator including a plurality of resistors disposed between a first voltage and a second voltage;

a first Digital-Analog (D/A) converter for receiving an upper i-th (i being a natural number less than k) bit of data of k (k being a natural number) bits, and for outputting two adjacent voltages among the voltages generated by the first voltage generator corresponding to input i-th bit;

a second voltage generator coupled to the first D/A converter, the second voltage generator dividing the two adjacent voltages from the first D/A converter into a plurality of another voltages;

a second D/A converter being supplied with the plurality of the another voltages, the second D/A converter outputting one of the another voltages generated by the second voltage generator as the data signal corresponding to upper bits among the data of k bits except the i-th bit; and shift registers coupled to the second D/A converter for supplying a reset signal and a shift signal to the second D/A converter;

wherein the second D/A converter includes:

a controller for generating a second control signal at a specific time and a first control signal otherwise according to a bit value of the data; and a signal generator for outputting one of the another voltages generated by the second voltage generator in synchronism with the shift signal as the data signal whenever the second control signal is supplied to the signal generator.

20. The flat panel display as recited in claim 19, wherein the signal generator comprises:

first switches, one of the another voltages from the second voltage generator being outputted to a data line through one of the first switches, whenever the one of the first switches is turned on;

second switches coupled to the controller, the first control signal or the second control signal being supplied to one of the first switches through one of the second switches whenever the one of the second switches is turned on, the one of the first switches being tuned on or off whenever the first control signal or the second control signal is supplied to the one of the first switches, each of the second switches coupled to one of the shift registers; and capacitors, each of the capacitors coupled to one of the second switches, the each of the capacitors being charged with the first control signal or the second control signal supplied through the one of the second switches, the first control signal or the second control signal stored in the each of the capacitors being supplied to one of the first switches that is coupled to the one of the second switches.

21. The flat panel display as recited in claim 20, wherein all of the shift registers supply the reset signals simultaneously during a reset period, each of the second switches being turned on whenever the reset signal is supplied to the each of the second switches.

22. The flat panel display as recited in claim 21, wherein the first control signal is supplied to the first switches during the reset period, each of the first switches being turned off whenever the first control signal is supplied to the each of the first switches.

23. The flat panel display as recited in claim 20, wherein each of the second switches is turned on whenever the shift signal is supplied to the each of the second switches, the shift registers sequentially supplying the shift signals to sequentially turn on the second switches.

24. The flat panel display as recited in claim 23, wherein the controller supplies the second control signal in synchronism with one of the shift signals, one of the plurality of first switches being turned on whenever the one of the first switches is supplied with the second control signal.

25. The flat panel display as recited in claim 20, further comprising a precharge switch being supplied with the lowest another voltages among the another voltages from the second voltage generator, the lowest another voltage being supplied to the data line through the precharge switch.

26. The flat panel display as recited in claim 25, wherein the precharge switch is turned on prior to an output of the data signal.

* * * * *